(12) United States Patent
Patil et al.

(10) Patent No.: US 11,296,024 B2
(45) Date of Patent: Apr. 5, 2022

(54) NESTED INTERCONNECT STRUCTURE IN CONCENTRIC ARRANGEMENT FOR IMPROVED PACKAGE ARCHITECTURE

(71) Applicant: QUALCOMM Incorporated, San Diego, CA (US)

(72) Inventors: Aniket Patil, San Diego, CA (US); Hong Bok We, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 26 days.

(21) Appl. No.: 16/875,579

(22) Filed: May 15, 2020

(65) Prior Publication Data

US 2021/0358839 A1 Nov. 18, 2021

(51) Int. Cl.
*H01L 23/528* (2006.01)
*H01L 23/498* (2006.01)
*H01L 21/56* (2006.01)
*H01L 21/48* (2006.01)
*H01L 23/31* (2006.01)

(52) U.S. Cl.
CPC ........ *H01L 23/528* (2013.01); *H01L 21/4857* (2013.01); *H01L 21/56* (2013.01); *H01L 23/3128* (2013.01); *H01L 23/49822* (2013.01)

(58) Field of Classification Search
CPC .............. H01L 23/528; H01L 23/3128; H01L 23/49822; H01L 21/4857; H01L 21/56
See application file for complete search history.

(56) References Cited

U.S. PATENT DOCUMENTS

| | | | | |
|---|---|---|---|---|
| 8,653,625 B2 * | 2/2014 | Hui | ...................... | H01L 21/4857 257/532 |
| 9,318,376 B1 * | 4/2016 | Holm | ..................... | H01L 23/481 |
| 10,236,254 B1 * | 3/2019 | Arai | ..................... | H01L 23/5228 |
| 10,304,852 B1 * | 5/2019 | Cui | ..................... | H01L 27/1157 |
| 10,326,028 B1 * | 6/2019 | Kolev | ............... | H01L 29/66083 |
| 2011/0316063 A1 * | 12/2011 | Tang | .................. | G11C 13/0069 257/314 |
| 2012/0105129 A1 * | 5/2012 | Naffziger | ............ | H01L 23/5286 327/419 |
| 2015/0279772 A1 * | 10/2015 | Inagaki | ............. | H01L 23/49827 257/668 |
| 2015/0357316 A1 * | 12/2015 | Inagaki | ............... | H01L 23/5383 257/774 |
| 2017/0287781 A1 * | 10/2017 | Karnik | .................. | H01L 23/481 |
| 2018/0226357 A1 * | 8/2018 | Kong | ............... | H01L 23/49866 |
| 2019/0190235 A1 * | 6/2019 | Ferreira Villares | ... | H01S 5/0215 |
| 2020/0006304 A1 * | 1/2020 | Chang | .................. | H01L 25/167 |
| 2020/0258975 A1 * | 8/2020 | Shan | ................. | H01L 23/49838 |
| 2020/0279815 A1 * | 9/2020 | Huang | .................. | H01L 23/552 |

(Continued)

*Primary Examiner* — Nathan W Ha
(74) *Attorney, Agent, or Firm* — Seyfarth Shaw LLP

(57) ABSTRACT

An integrated circuit (IC) package is described. The IC package includes back-end-of-line layers on a substrate. The IC package also includes a nested interconnect structure on the back-end-of-line layers on the substrate. The nested interconnect structure is composed of an inner core pad and an outer ring pad in a concentric arrangement. The IC package further includes a redistribution layer on the nested interconnect structure. The IC package also includes an under bump metallization layer on the redistribution layer to support package balls.

17 Claims, 13 Drawing Sheets

(56) References Cited

U.S. PATENT DOCUMENTS

| | | | |
|---|---|---|---|
| 2020/0335258 A1* | 10/2020 | Kodama | H05K 1/0233 |
| 2020/0364600 A1* | 11/2020 | Elsherbini | H01L 21/486 |
| 2021/0082921 A1* | 3/2021 | Wada | H01L 23/528 |
| 2021/0104525 A1* | 4/2021 | Tsai | H01L 23/528 |
| 2021/0217694 A1* | 7/2021 | Jain | H01L 21/76224 |
| 2021/0225780 A1* | 7/2021 | Wu | H01L 23/49822 |

* cited by examiner

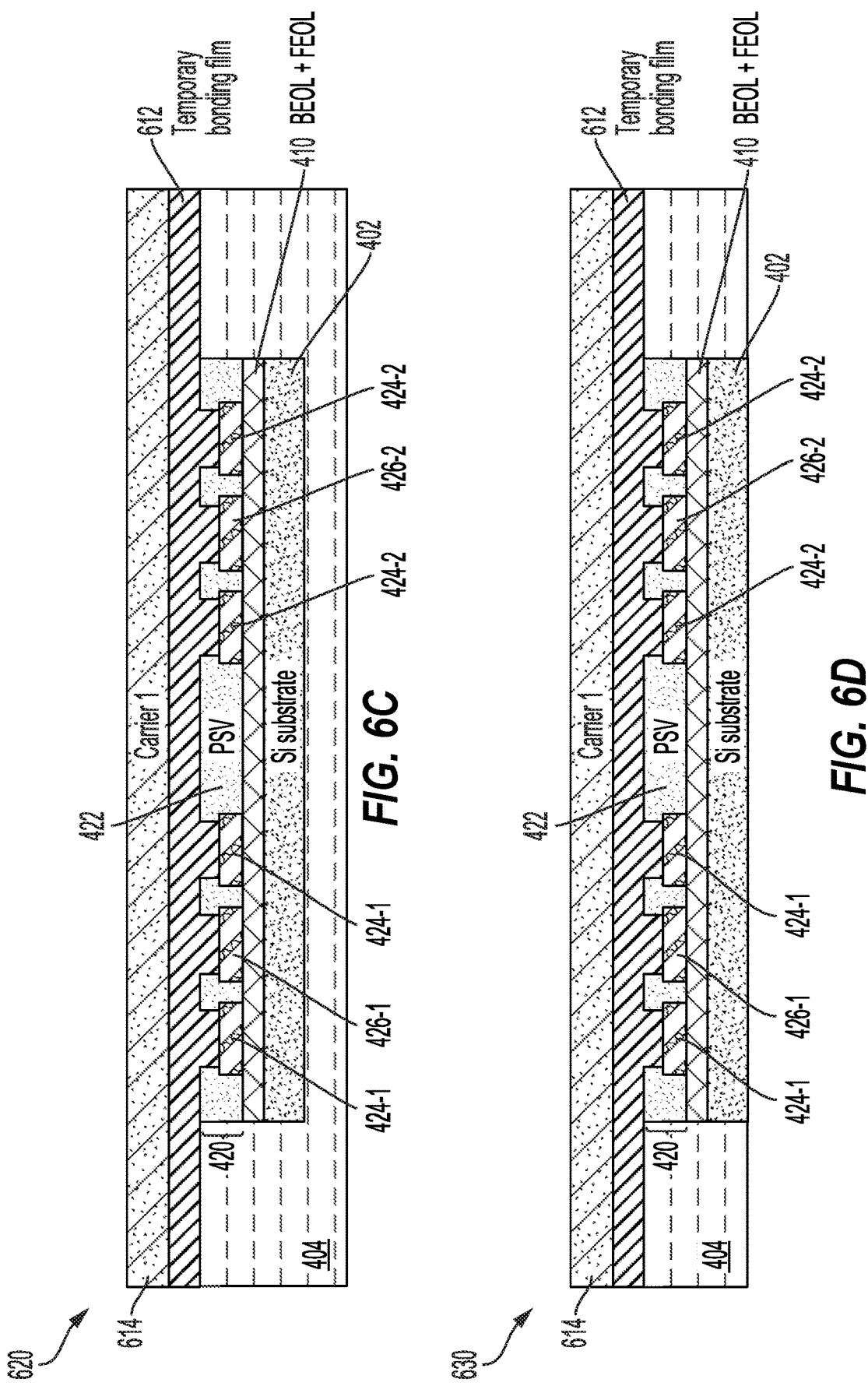

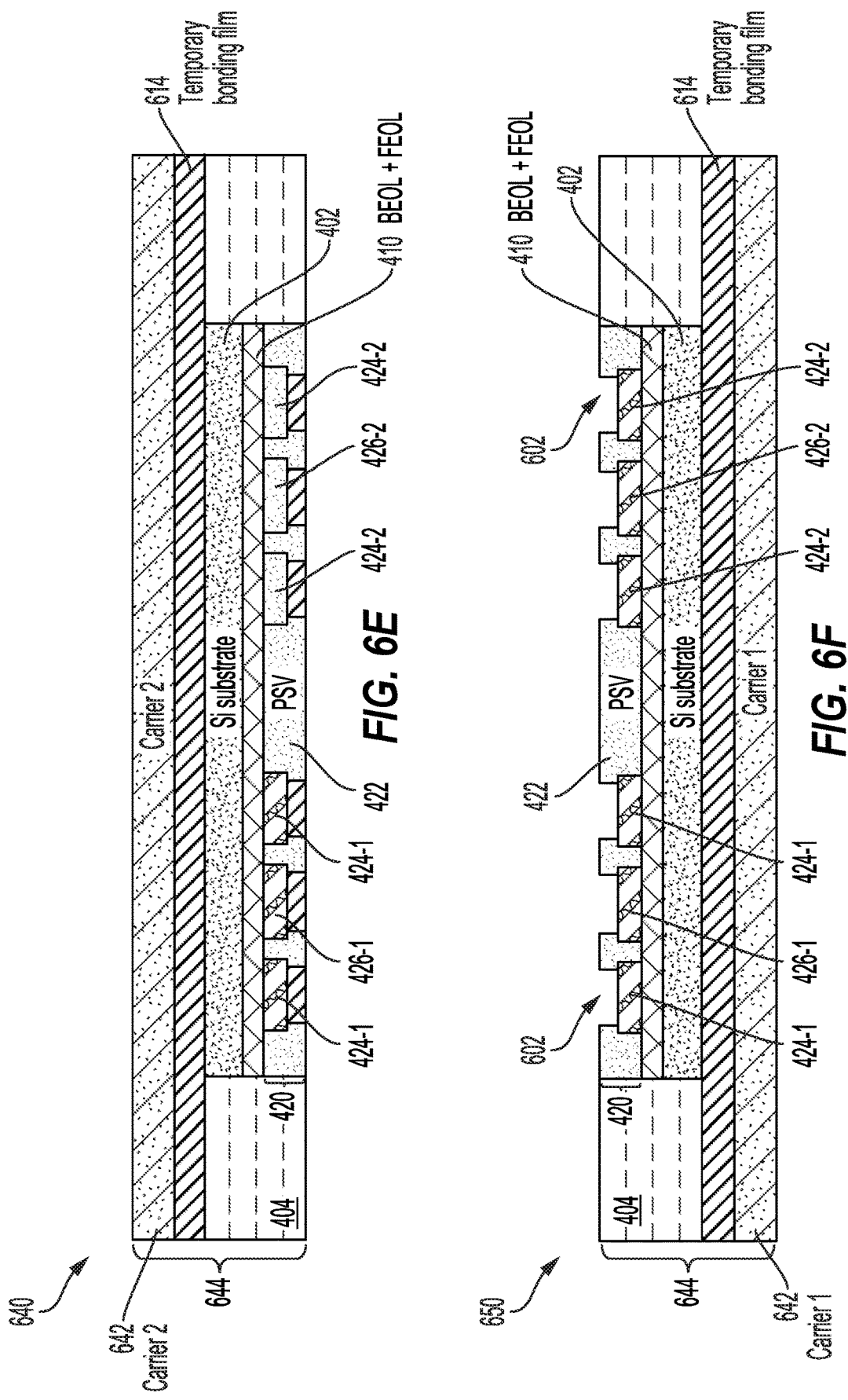

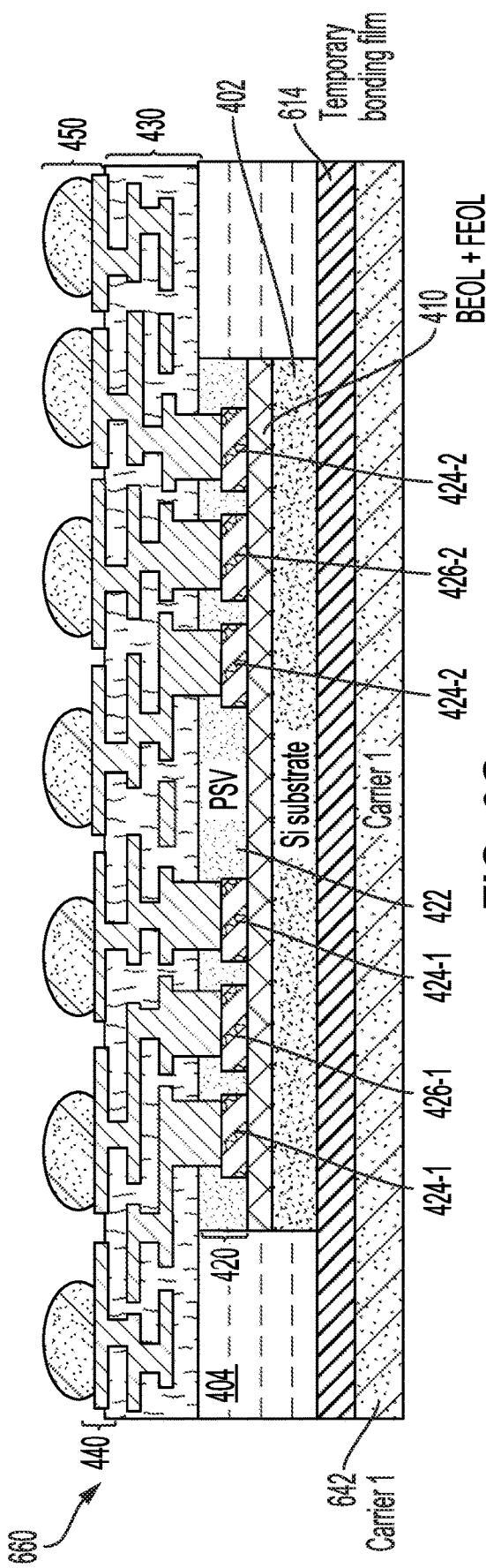
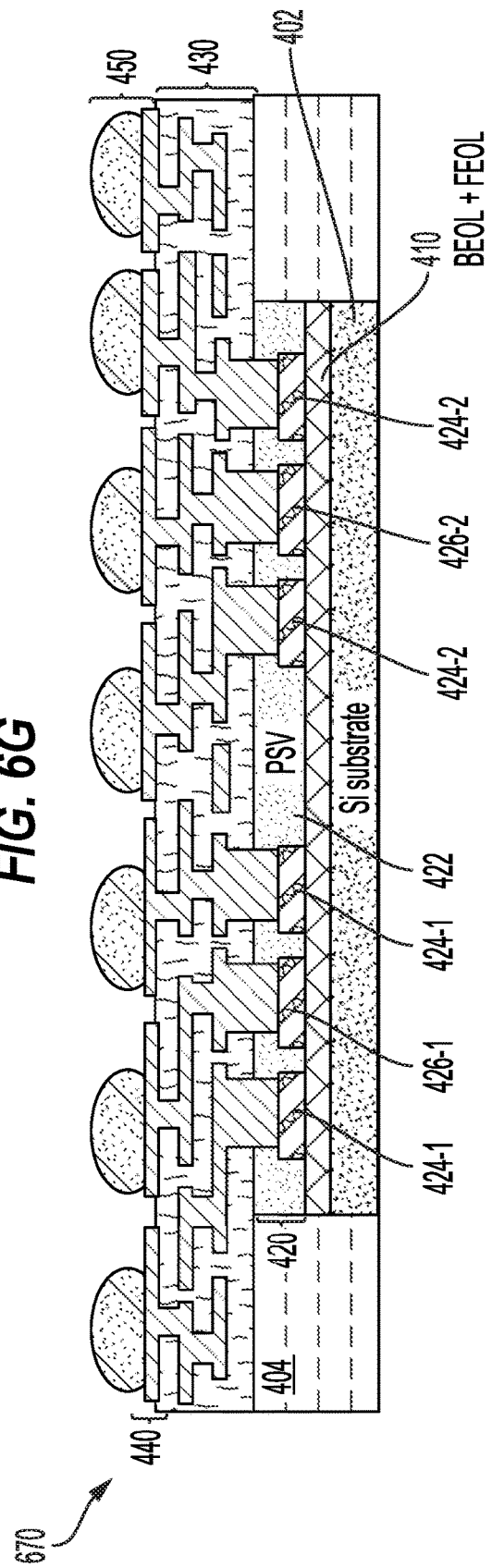

NESTED INTERCONNECT STRUCTURE IN CONCENTRIC ARRANGEMENT FOR IMPROVED PACKAGE ARCHITECTURE

BACKGROUND

Field

Aspects of the present disclosure relate to integrated circuits and, more particularly, to a nested interconnect structure in a concentric arrangement for an improved package architecture.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile applications demand a small form factor, low cost, tight power budget, and high electrical performance. Packaging technologies have evolved to meet these divergent goals. For example, a three-dimensional (3D) package may contain two or more chips (e.g., integrated circuits (ICs)) stacked so that they occupy less floor space and/or have greater connectivity. Improved packaging technologies for small form factor devices (e.g., Smartphones) to meet a tight power budget and high electric performance are desired.

SUMMARY

An integrated circuit (IC) package is described. The IC package includes back-end-of-line layers on a substrate. The IC package also includes a nested interconnect structure on the back-end-of-line layers on the substrate. The nested interconnect structure is composed of an inner core pad and an outer ring pad in a concentric arrangement. The IC package further includes a redistribution layer on the nested interconnect structure. The IC package also includes an under bump metallization layer on the redistribution layer to support package balls.

A method for fabricating a nested interconnect structure in a concentric arrangement is described. The method includes forming an inner core pad and an outer ring pad in the concentric arrangement to contact back-end-of-line layers on a substrate as the nested interconnect structure. The method also includes forming redistribution layers on the nested interconnect structure to separately contact the inner core pad and the outer ring pad. The method further includes forming an under bump metallization layer on the redistribution layers to support package balls.

An integrated circuit (IC) package is described. The IC package includes back-end-of-line layers on a substrate. The IC package also includes a nested interconnect structure on the back-end-of-line layers on the substrate. The nested interconnect structure is composed of an inner core pad and an outer ring pad in a concentric arrangement. The IC package further includes a redistribution layer on the nested interconnect structure. The IC package also includes means for supporting package balls on the redistribution layer.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 6A-6H are cross-section diagrams illustrating a process of fabricating the nested interconnect structure in the package of FIG. 4C, according to aspects of the present disclosure.

DETAILED DESCRIPTION

Figure 1:
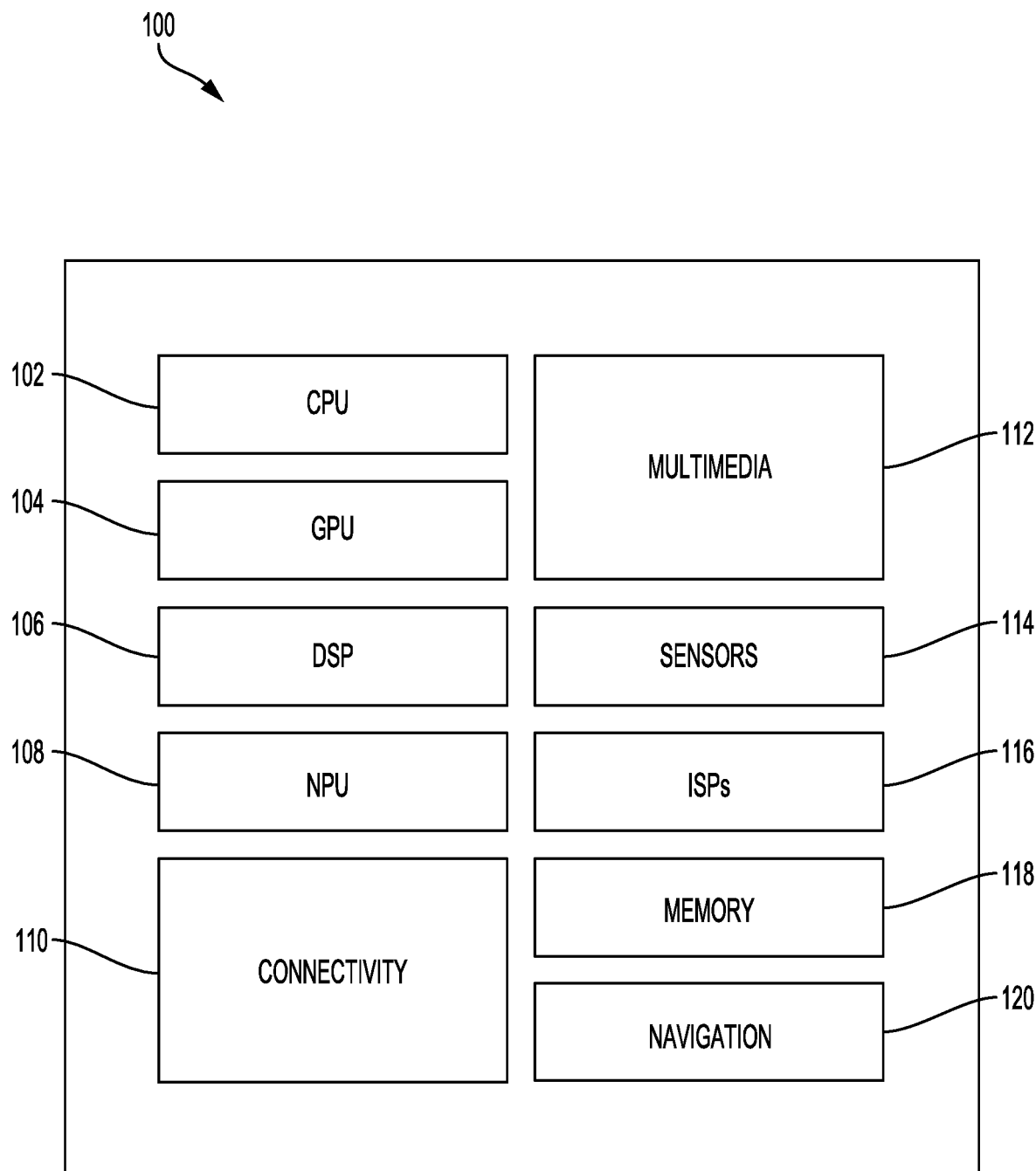
FIG. 1 illustrates an example implementation of a system-on-a-chip (SoC), including a nested interconnect structure in a concentric arrangement, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. Electrical connections exist at each of the levels of the system hierarchy to connect different devices together on an integrated circuit. As integrated circuits become more complex, however, more interconnect layers are used to provide the electrical connections between the devices. More recently, the number of interconnect levels for circuitry has substantially increased due to the large number of devices that are now interconnected in a modern electronic device.

These interconnections include back-end-of-line (BEOL) interconnect layers, which may refer to the conductive interconnect layers for electrically coupling to front-end-of-line (FEOL) active devices of an integrated circuit. The various back-end-of-line interconnect layers are formed at corresponding back-end-of-line interconnect levels. Lower back-end-of-line interconnect levels use thinner metal layers relative to upper back-end-of-line interconnect levels. The back-end-of-line interconnect layers may electrically couple to middle-of-line (MOL) interconnect layers, which interconnect to the front-end-of-line active devices of an integrated circuit.

State-of-the-art mobile applications demand a small form factor, a low cost, a tight power budget, and a high electrical performance. Packaging technologies have evolved to meet these divergent goals. For example, fan-out (FO) wafer level packaging (WLP) or FO-WLP process technology is a new development in packaging technology that is useful for mobile applications. A chip first fan-out WLP process technology solution provides the benefit of having a conductive (e.g., copper (Cu)) plating directly on a conductive pad (e.g., aluminum pad (AP)) layer of a processor die, referred to as an AP pad or an AP layer. This chip first fan-out WLP process technology solution provides flexibility to fan-in and fan-out connections from the processor die to package balls. This solution also provides a height reduction of a first level interconnect between the processor die and the package balls.

Various aspects of the disclosure provide a nested interconnect structure in a concentric arrangement. The process flow for fabrication of the nested interconnect structure in a concentric arrangement may include wafer level packaging (WLP) process technology. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device. The terms "substrate," "wafer," and "laminate" may be used interchangeably. Similarly, the terms "chip" and "die" may be used interchangeably.

Aspects of the present disclosure adapt the chip first fan-out WLP process technology and build a more efficient first level interconnect structure. According to this aspect of the present disclosure, an AP layer structure and a fan-out WLP layer build-up structure are improved for a first level interconnection (e.g., between the processor die and the package balls). In one aspect of the present disclosure, a nested interconnect structure in a concentric arrangement is provided for configuration of the AP layer structure. This concentric AP layer structure also improves a bump density of the package balls. In addition, the concentric AP layer structure enables nesting of two networks placed in a concentric arrangement.

According to one aspect of the present disclosure, the concentric AP layer structure is composed of a central AP pad (e.g., an inner core) and an outer ring AP pad (e.g., an outer shell AP pad). According to this aspect of the present disclosure, a nested AP structure in a concentric arrangement supports network selection flexibility based on application. For example, the nested AP structure enables support for a power network combined with a ground network, a signal network combined with a ground network, and/or a differential signal pair (e.g., P-type/N-type), etc.

FIG. 1 illustrates an example implementation of a host system-on-a-chip (SoC) 100, which includes a nested interconnect structure in a concentric arrangement, in accordance with aspects of the present disclosure. The host SoC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
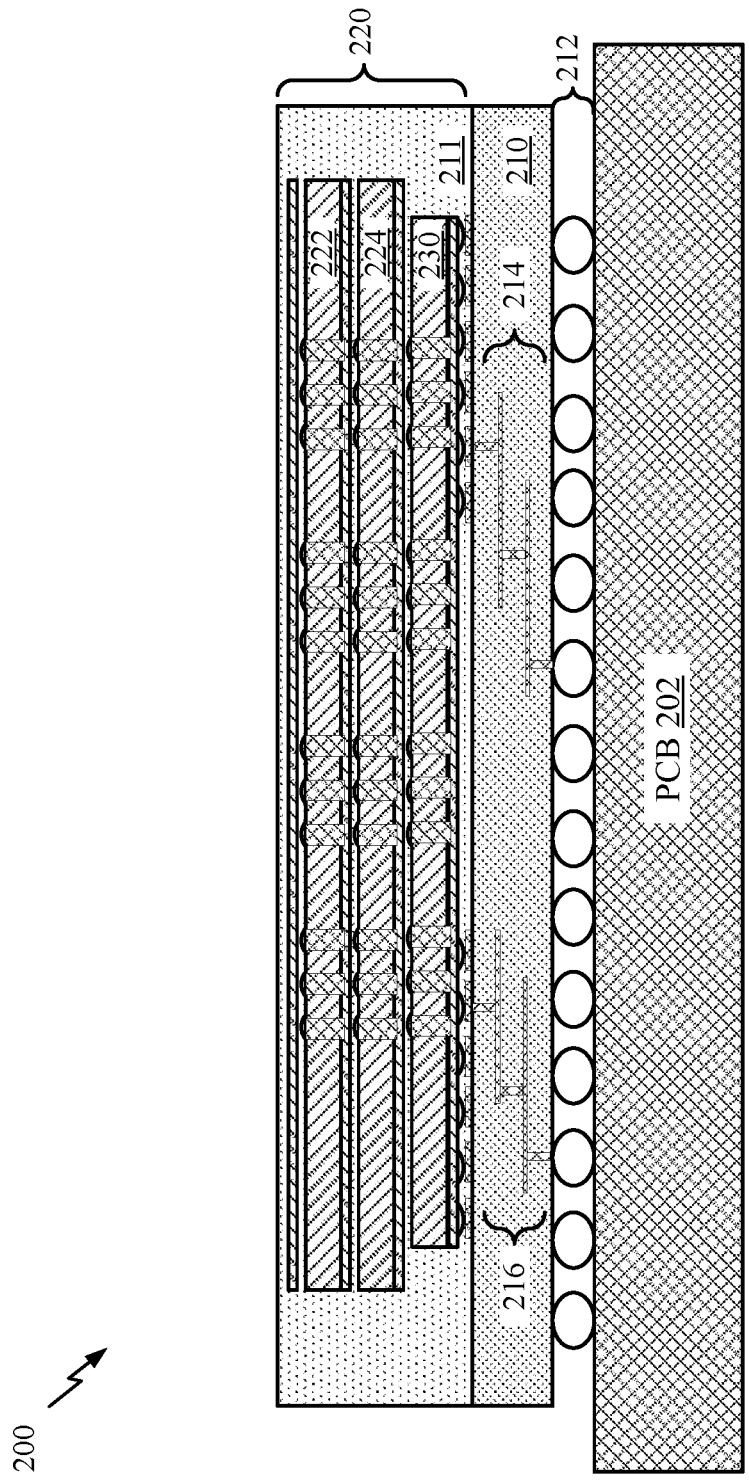
FIG. 2 shows a cross-sectional view of a stacked integrated circuit (IC) package, including the system-on-a-chip (SoC) of FIG. 1.

FIG. 2 shows a cross-sectional view illustrating a stacked integrated circuit (IC) package 200 of the SoC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the SoC of FIG. 1.

Figure 3:
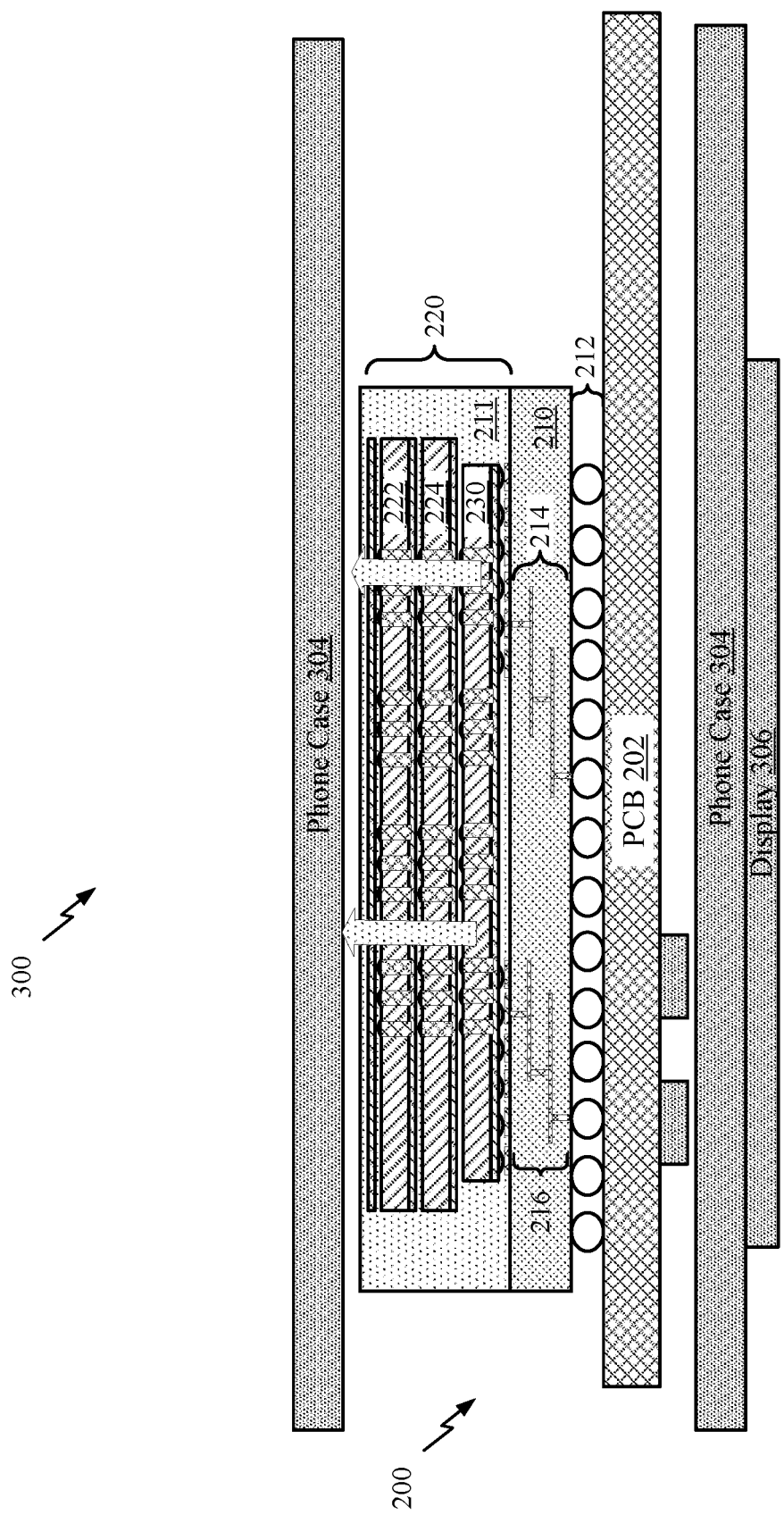
FIG. 3 shows a cross-sectional view illustrating the stacked integrated circuit (IC) package of FIG. 2, incorporated into a wireless device, according to one aspect of the disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a Smartphone, tablet, handheld device, or other limited form factor device configured for 5G communications. Representatively, the stacked IC package 200 is arranged within a phone case 304, including a display 306. In this configuration, nested interconnect structures in concentric arrangements (not shown) are integrated into the stacked IC package 200, for example, as shown in FIGS. 4A and 4B.

Figure 4A:
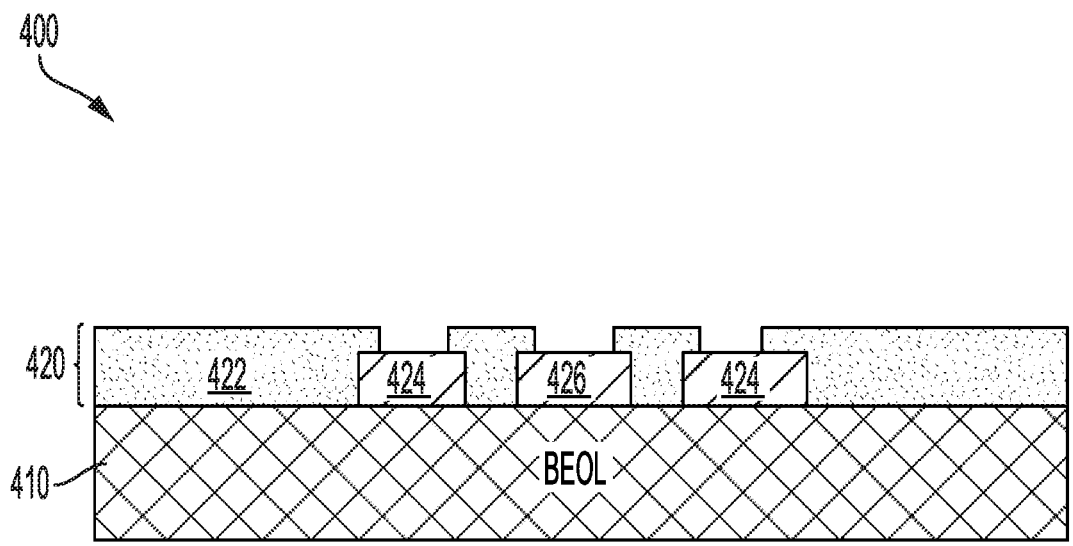
FIGS. 4A-4C are layout and cross-section diagrams illustrating a nested interconnect structure in a concentric arrangement in a package, according to aspects of the present disclosure.
Figure 4B:
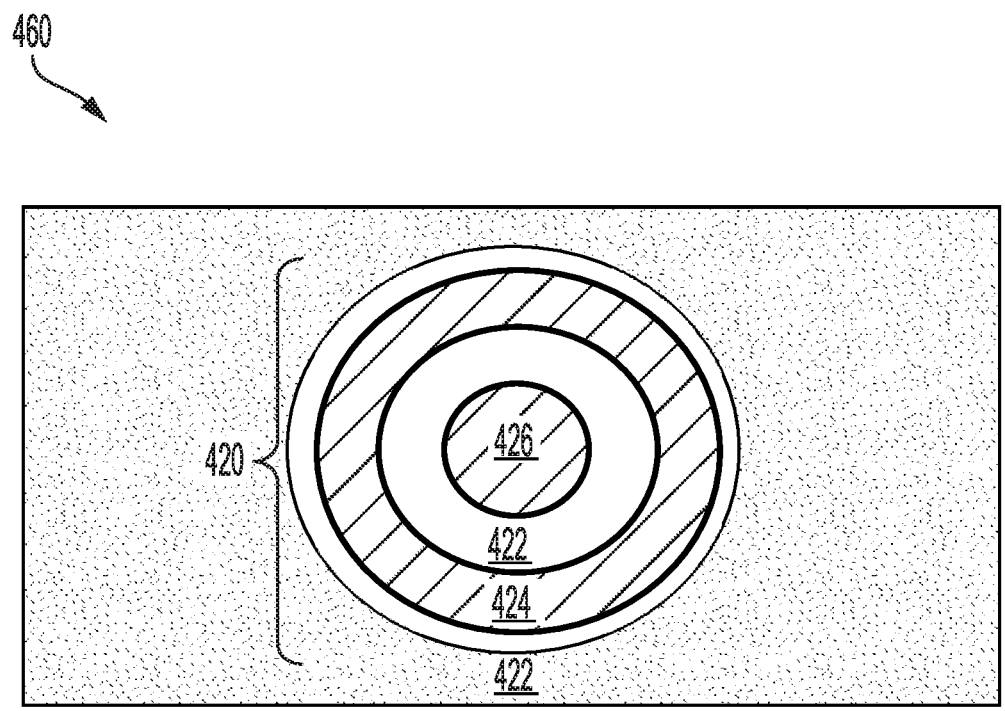
Figure 4C:
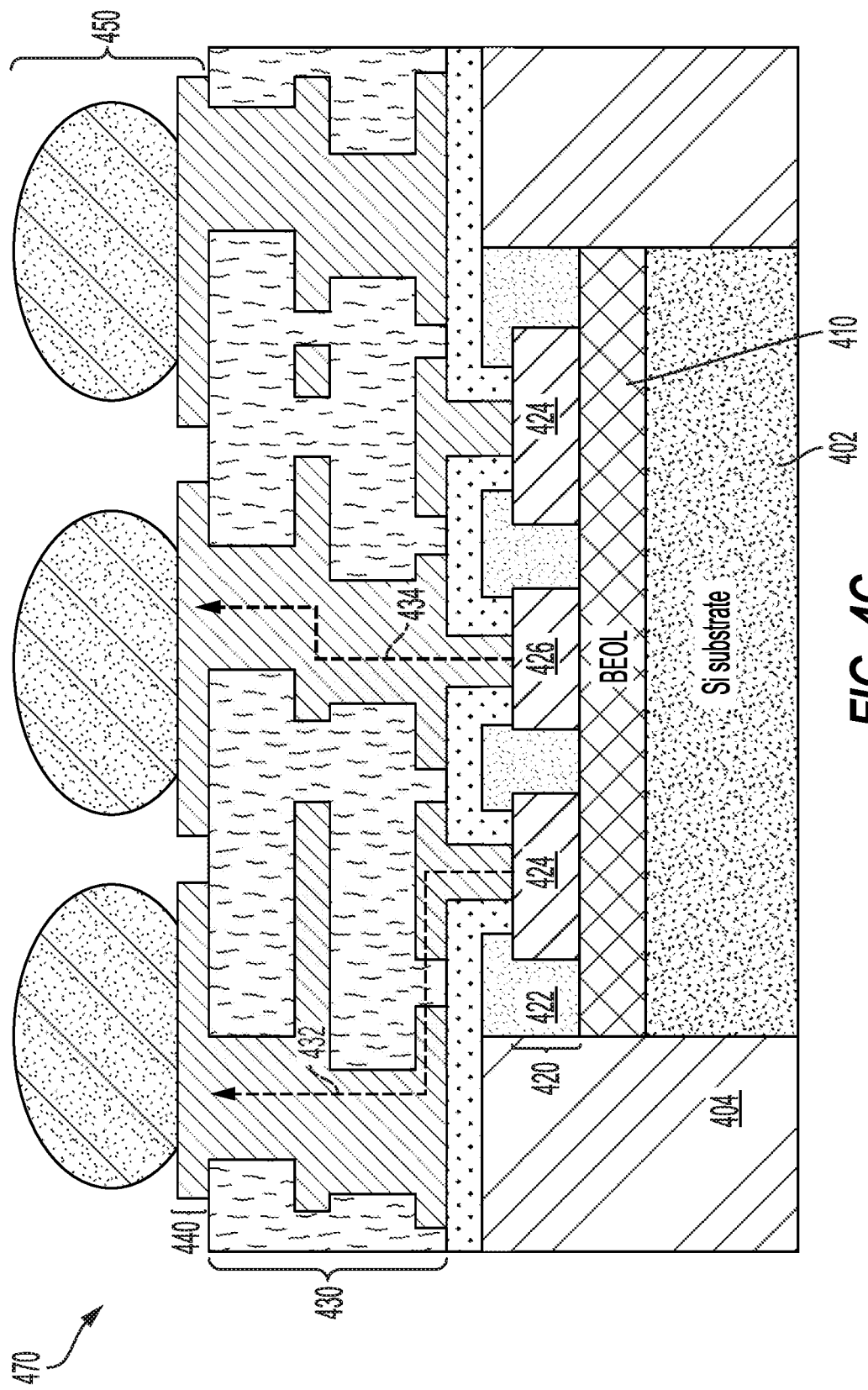

FIGS. 4A-4C are layout and cross-section diagrams illustrating a nested interconnect structure in a concentric arrangement in a package, according to aspects of the present disclosure.

FIG. 4A is a cross-section diagram 400 of a nested interconnect structure 420 in a concentric arrangement, according to aspects of the present disclosure. According to this aspect of the present disclosure, the nested interconnect structure 420 is composed of an inner core pad 426 and an outer ring pad 424. The inner core pad 426 and an outer ring pad 424 are surrounded by a passivation layer 422 (e.g., polyimide), on a back-end-of-line layer 410 (BEOL). In this configuration, the nested interconnect structure 420 is shown in a concentric arrangement, as further illustrated in FIG. 4B.

FIG. 4B is an overhead view 460 of the nested interconnect structure 420 of FIG. 4A in a concentric arrangement, according to aspects of the present disclosure. In this aspect of the present disclosure, the nested interconnect structure 420 may be a nested aluminum pad (AP) layer structure composed of a central AP pad (e.g., the inner core pad 426), an outer ring AP pad (e.g., the outer ring pad 424), and surrounded by a passivation layer 422. According to aspects of the present disclosure, a single connection AP layer structure is reconfigured to form the nested interconnect structure 420 in the concentric configuration of FIG. 4B.

According to this aspect of the present disclosure, a nested AP layer structure in the concentric arrangement of FIG. 4B provides network selection flexibility based on application. For example, the nested interconnect structure 420 enables support for a power network/ground network, a signal network/ground network, a differential signal pair (e.g., P-type/N-type), and other like network, as further illustrated in FIG. 4C.

FIG. 4C is a cross-section diagram of a package 470, having the nested interconnect structure 420 of FIGS. 4A and 4B, according to aspects of the present disclosure. In this configuration, the package 470 includes a substrate 402 (e.g., an active substrate) and a mold compound 404. The package 470 also includes the BEOL layer 410 on a surface of the substrate 402. The package 470 further includes the nested interconnect structure 420 on the BEOL layer 410. According to aspects of the present disclosure, the substrate 402 includes an active die, such as a server die, a radio frequency (RF) die, a mobile station modem, or other like active device.

The package 470 further includes a redistribution layer 430 to separately contact the inner core pad 426 and the outer ring pad 424 of the nested interconnect structure 420. In addition, an under bump metallization layer 440 is on the surface of the redistribution layer 430 to support the package balls 450. In this example, the nested interconnect structure 420 enables nesting of a first network 432 and a second network 434 (e.g., a power network/ground network, a signal network/ground network, a first differential signal and a second differential signal (e.g., P-type/N-type differential signal pair), etc.). Aspects of the present disclosure adapt an AP layer structure and a fan-out wafer level package (WLP) layer build-up structure to improve the first level interconnection (e.g., the substrate 402 and the package balls 450).

Figure 5:
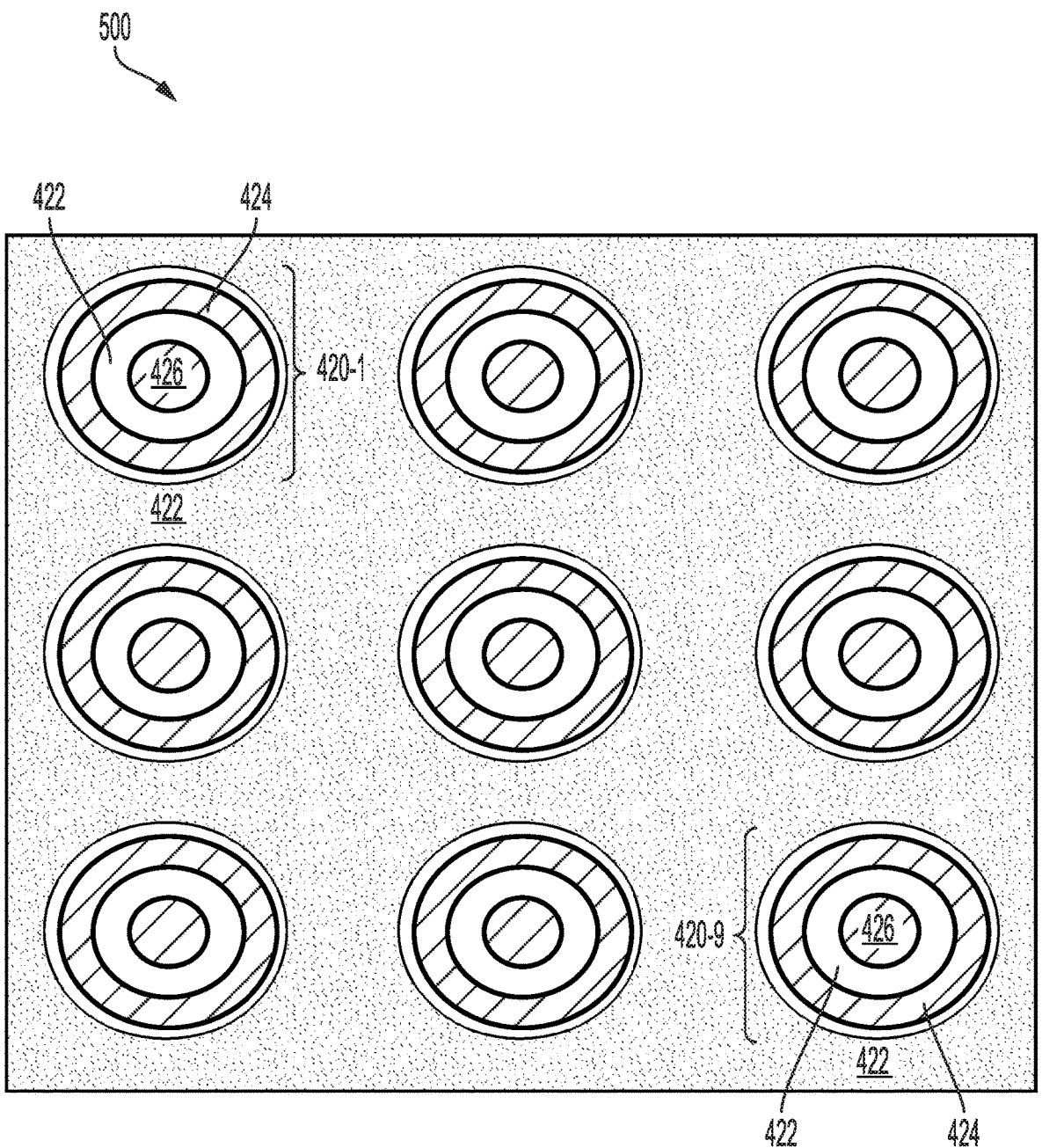
FIG. 5 is an overhead view of a layout of multiple ones of the nested interconnect structure of FIG. 4B in a concentric arrangement, according to aspects of the present disclosure.

FIG. 5 is an overhead view of a layout 500 of multiple ones of the nested interconnect structure 420 (e.g., 420-1 to 420-9) of FIG. 4B in a concentric arrangement, according to aspects of the present disclosure. In one aspect of the present disclosure, a nested interconnect structure in a concentric arrangement is provided for configuration of an AP layer structure. This nested AP layer structure also improves a bump density of the package balls. In particular, the layout 500 doubles a quantity of bumps (e.g., 18), while consuming approximately fifty (50) percent (%) more die area. That is, the nested interconnect structure 420 of the layout 500 provides a fifty (50) percent (%) bump density growth relative to existing solutions.

FIGS. 6A-6H are cross-section diagrams illustrating a process of fabricating the nested interconnect structure 420 in the package 470 of FIG. 4C, according to aspects of the present disclosure. Although two of the nested interconnect structures 420 (e.g., 420-1 and 420-2) are shown in FIGS. 6A-6H, it should be recognized that any number of the nested interconnect structure 420 may be used depending on the desired application, such as a processor die package.

Figure 6A:
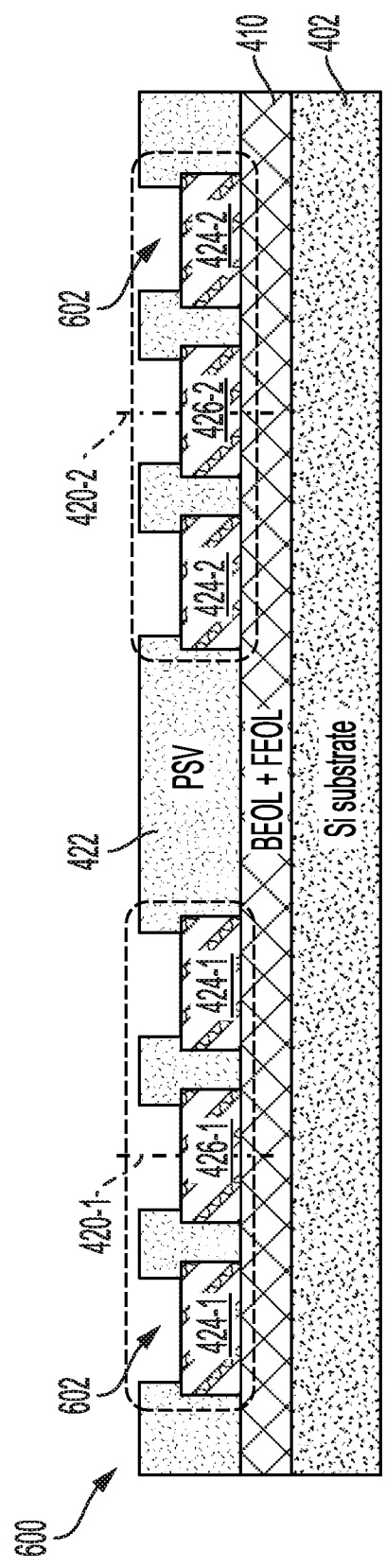

As shown in FIG. 6A, at step 600, an incoming wafer with the nested interconnect structure in a concentric arrangement is shown with passivation openings 602. In this example, the nested interconnect structure 420 includes a first nested interconnect structure 420-1 and a second nested interconnect structure 420-2. The first nested interconnect structure 420-1 is composed of an inner core pad 426-1 and an outer ring pad 424-1. In addition, the second nested interconnect structure 420-2 is composed of an inner core pad 426-2 and an outer ring pad 424-2.

Figure 6B:
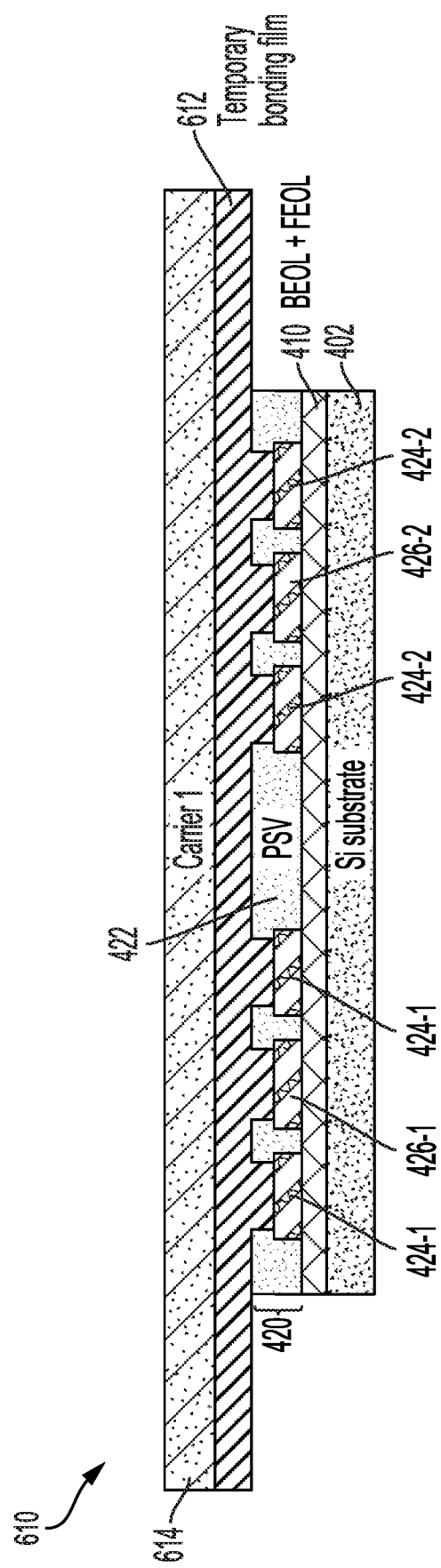

As shown in FIG. 6B, at step 610, a first carrier 612 is attached to the nested interconnect structure 420 using a bonding film 614 as a reconstituted wafer (e.g., substrate 402). As shown in FIG. 6C, at step 620, a mold compound 404 is deposited on the surface of the substrate 402, the bonding film 614, sidewalls of the nested interconnect structure 420, and the BEOL layer 410.

As shown in FIG. 6D, at step 630, a backgrind process is performed on the mold compound 404 until a surface of the substrate 402 is exposed. As shown in FIG. 6E, at step 640, the first carrier 612 is removed and an assembly 644 is flipped. Once flipped, a second carrier 642 is attached to a surface of the substrate 402 and the mold compound 404 using the bonding film 614.

As shown in FIG. 6F, at step 650, the assembly 644 of FIG. 6E is prepared for formation of fan-in and fan-out redistribution layers, according aspects of the present disclosure. At step 650, the assembly 644 is flipped and the inner core pads (e.g., 426-1 and 426-2) and the outer ring pads (e.g., 424-1 and 424-2) are exposed by removing a remaining portion of the bonding film 614.

As shown in FIG. 6G, at step 660 the redistribution layer 430 is formed on the nested interconnect structure 420, according to aspects of the present disclosure. Formation of the redistribution layer 430 may include coating of a photomask on the nested interconnect structure 420. The photomask is exposed and developed to define the fan-in and fan-out layers of the redistribution layer 430. Once defined, a seed layer is deposited. This is followed by formation of the redistribution layer 430 and the under bump metallization layer 440. Formation of the redistribution layer 430 may include a lithography process, a plating process, a stripping process, and an etching process. Once the under bump metallization layer 440 is formed, the package balls 450 are attached using a ball attach process. As shown in FIG. 6H, at step 670, the second carrier 642 is removed and singulation is performed to complete the package 470.

Figure 7:
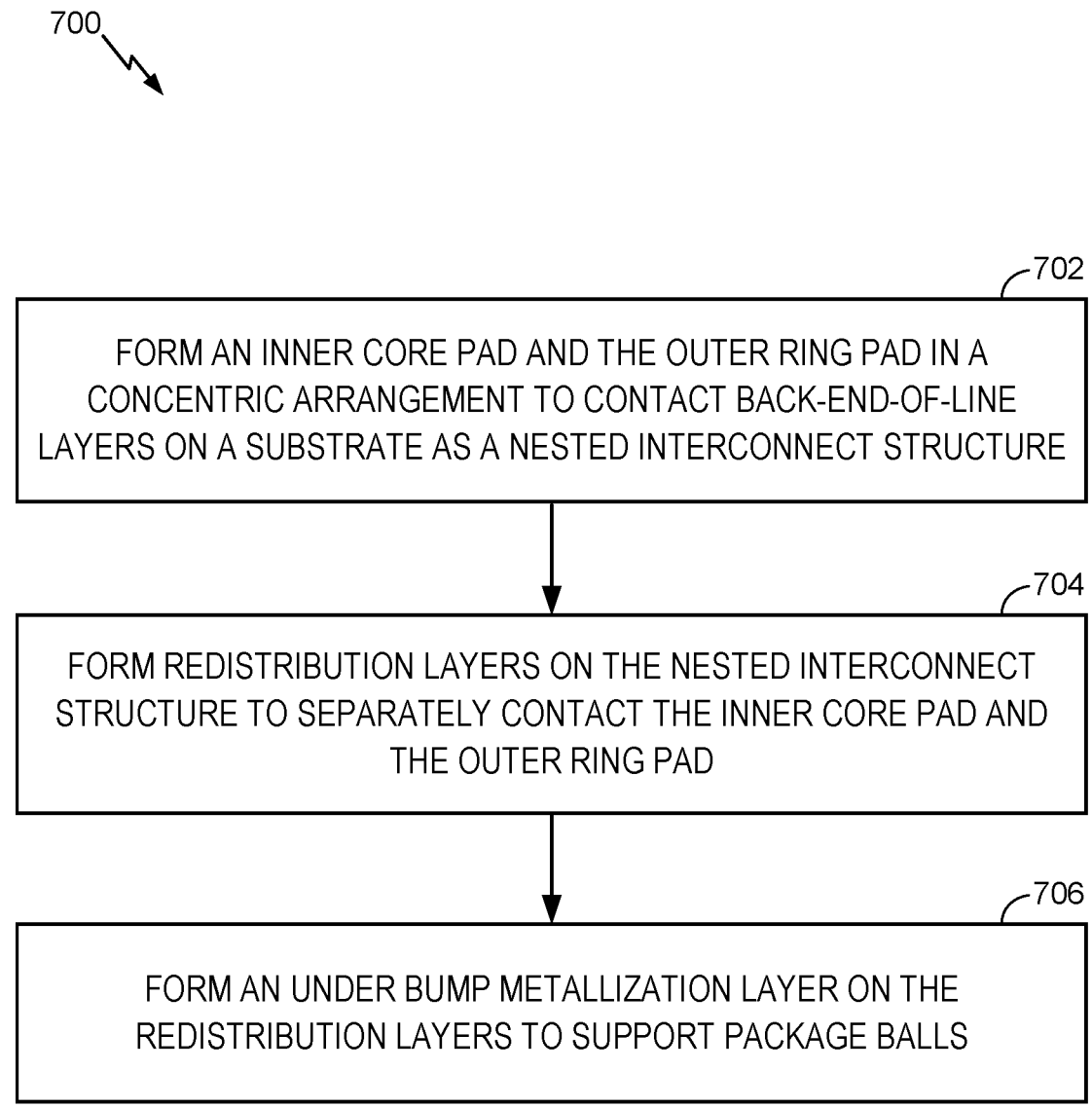
FIG. 7 is a process flow diagram illustrating a method for fabricating a nested interconnect structure in a concentric arrangement, according to an aspect of the present disclosure.

FIG. 7 is a process flow diagram illustrating a method for fabricating a nested interconnect structure in a concentric arrangement, according to an aspect of the present disclosure. A method 700 begins in block 702, in which an inner core pad and the outer ring pad are formed in a concentric arrangement to contact back-end-of-line (BEOL) layers on a substrate as the nested interconnect structure. For example, as shown in FIG. 4A, the nested interconnect structure 420 is composed of an inner core pad 426 and an outer ring pad 424. The inner core pad 426 and outer ring pad 424 are surrounded by a passivation layer 422 (e.g., polyimide), on a BEOL layer 410.

At block 704, redistribution layers are formed on the nested interconnect structure to separately contact the inner core pad and the outer ring pad. For example, as shown in FIG. 4C, the package 470 includes a redistribution layer 430 to separately contact the inner core pad 426 and the outer ring pad 424 of the nested interconnect structure 420. In this example, the nested interconnect structure 420 enables nesting of a first network 432 and a second network 434 (e.g., a power network/ground network, a signal network/ground network, a differential signal pair (e.g., P-type/N-type), etc.).

At block 706, an under bump metallization layer is formed on the redistribution layers to support package balls. For example, as shown in FIG. 4C, aspects of the present disclosure adapt an AP layer structure and a fan-out wafer level package (WLP) layer build-up structure to improve a first level interconnection, which may be between the substrate 402 and the package balls 450.

According to a further aspect of the present disclosure, an integrated circuit (IC) includes a nested interconnect structure in a concentric arrangement. In one configuration, the IC has means for means for supporting package balls on a redistribution layer. In one configuration, the supporting means may be the under bump metallization layer 440, as shown in FIG. 4. In another aspect, the aforementioned means may be any structure or any material configured to perform the functions recited by the aforementioned means.

Figure 8:
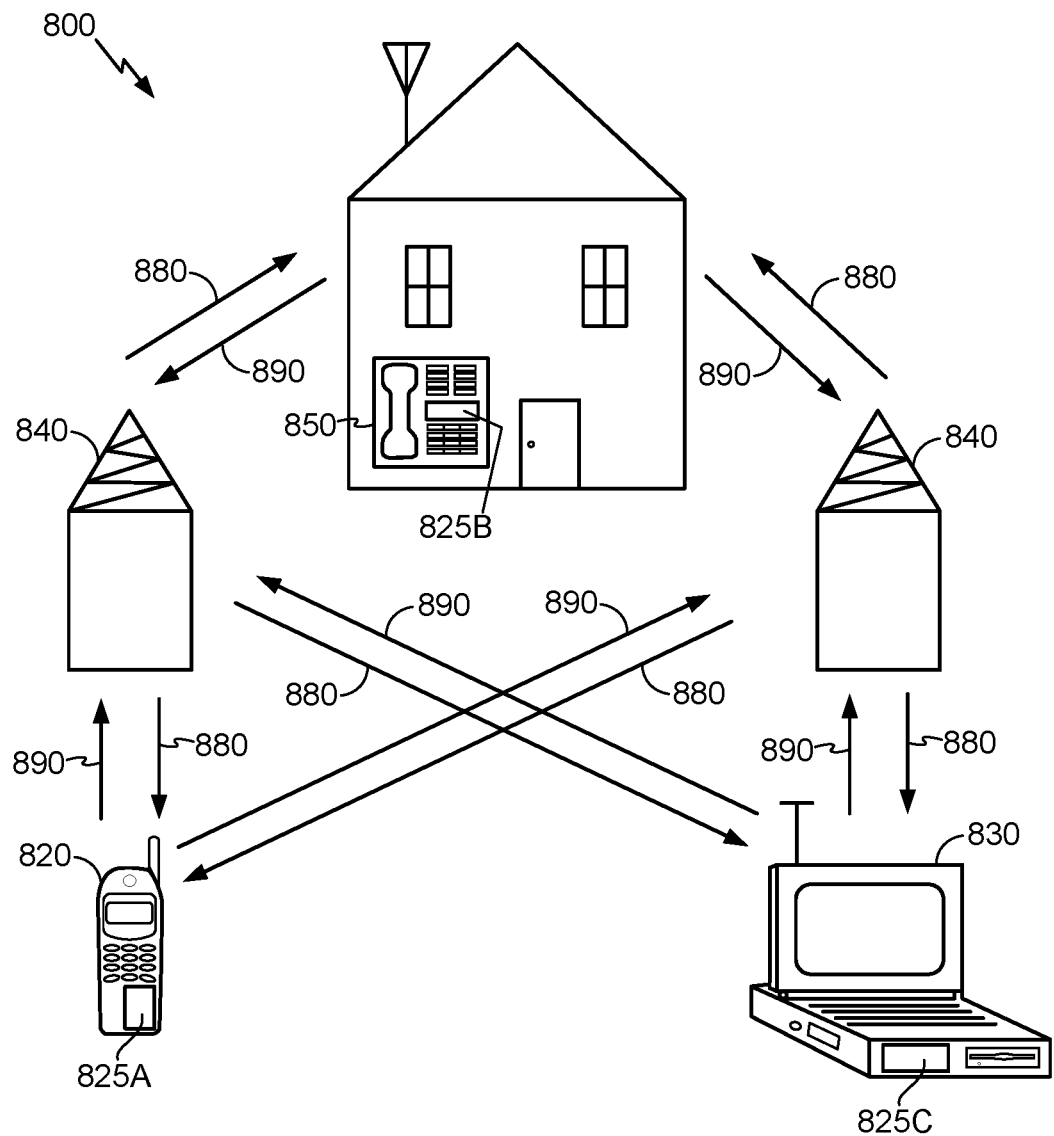
FIG. 8 is a block diagram showing an exemplary wireless communications system in which a configuration of the disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850, and two base stations 840. It will be recognized that wireless communications systems may have many more remote units and base stations. Remote units 820, 830, and 850 include IC devices 825A, 825C, and 825B that include the disclosed nested interconnect structure in the concentric arrangement. It will be recognized that other devices may also include the disclosed nested interconnect structure in the concentric arrangement, such as the base stations, switching devices, and network equipment. FIG. 8 shows forward link signals 880 from the base stations 840 to the remote units 820, 830, and 850, and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the disclosure is not limited to these exemplary illustrated units. Aspects of the present disclosure may be suitably employed in many devices, which include the disclosed nested interconnect structure in the concentric arrangement.

Figure 9:
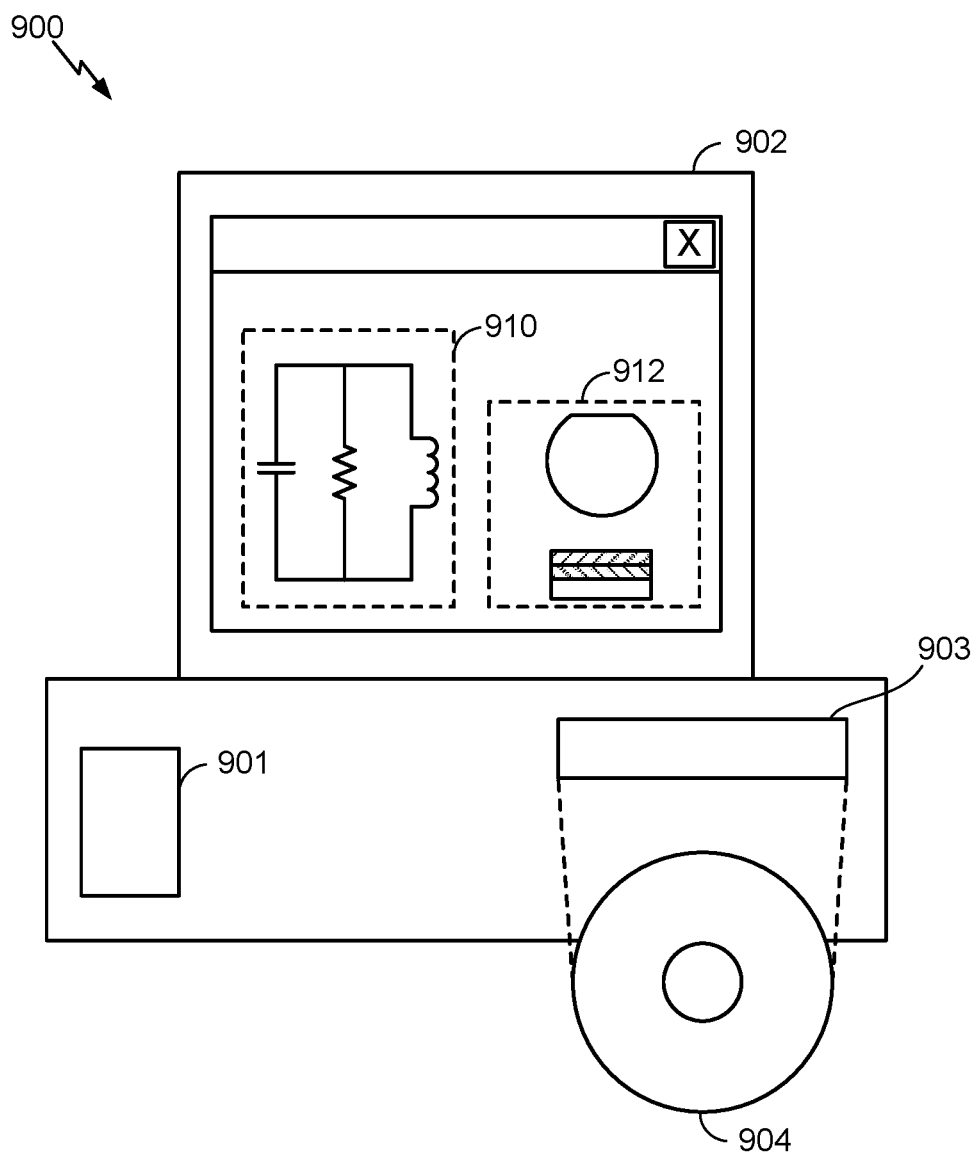
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitors disclosed above. A design workstation 900 includes a hard disk 901 containing operating system software, support files, and design software such as Cadence or OrCAD. The design workstation 900 also includes a display 902 to facilitate design of a circuit 910 or a radio frequency (RF) component 912, such as a nested interconnect structure in a concentric arrangement. A storage medium 904 is provided for tangibly storing the design of the circuit 910 or the RF component 912 (e.g., the nested interconnect structure in the concentric arrangement). The design of the circuit 910 or the RF component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the RF component 912 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
   back-end-of-line layers on a substrate;
   a nested interconnect structure on the back-end-of-line layers on the substrate, in which the nested interconnect structure comprises an inner core pad and an outer ring pad in a concentric arrangement, and in which the inner core pad supports a first network of the IC package and the outer ring pad supports a second network of the IC package;
   a redistribution layer on the nested interconnect structure; and
   an under bump metallization layer on the redistribution layer to support package balls.

2. The IC package of claim 1, in which the first network of the IC package comprises a power network and the second network of the IC package comprises a ground network.

3. The IC package of claim 1, in which the first network of the IC package comprises a signal network and the second network of the IC package comprises a ground network.

4. The IC package of claim 1, in which the first network of the IC package comprises a first differential signal and the second network of the IC package comprises a second differential signal.

5. The IC package of claim 1, in which the nested interconnect structure comprises a nested aluminum pad (AP) layer structure comprising a central AP pad and an outer ring AP pad.

6. The IC package of claim 1, in which the substrate comprises an active die.

7. The IC package of claim 6, in which the active die comprises a server die.

8. The IC package of claim 6, in which the active die comprises a radio frequency (RF) die.

9. The IC package of claim 1, further comprising:
a mold compound on a surface of the redistribution layer and sidewalls of the nested interconnect structure, the back-end-of-line layers, and the substrate.

10. A method for fabricating a nested interconnect structure in a concentric arrangement, comprising:
forming an inner core pad and an outer ring pad in the concentric arrangement to contact back-end-of-line layers on a substrate as the nested interconnect structure;
forming redistribution layers on the nested interconnect structure to separately contact the inner core pad and the outer ring pad;
forming an under bump metallization layer on the redistribution layers to support package balls;
depositing a mold compound on a surface of the substrate, a bonding film, and sidewalls of the nested interconnect structure and the back-end-of-line layers; and
back-grinding the mold compound until the surface of the substrate is exposed.

11. The method of claim 10, further comprising:
supporting, by the inner core pad, a first network of the IC package; and
supporting, by the outer ring pad, a second network of the IC package.

12. The method of claim 11, in which the first network of the IC package comprises a power network and the second network of the IC package comprises a ground network.

13. The method of claim 11, in which the first network of the IC package comprises a signal network and the second network of the IC package comprises a ground network.

14. The method of claim 11, in which the first network of the IC package comprises a first differential signal and the second network of the IC package comprises a second differential signal.

15. An integrated circuit (IC) package, comprising:
back-end-of-line layers on a substrate;
a nested interconnect structure on the back-end-of-line layers on the substrate, in which the nested interconnect structure comprises an inner core pad and an outer ring pad in a concentric arrangement, and in which the inner core pad supports a first network of the IC package and the outer ring pad supports a second network of the IC package;
a redistribution layer on the nested interconnect structure; and
means for supporting package balls on the redistribution layer.

16. The IC package of claim 15, in which the first network of the IC package comprises a power network and the second network of the IC package comprises a ground network.

17. The IC package of claim 15, in which the first network of the IC package comprises a first differential signal and the second network of the IC package comprises a second differential signal.

* * * * *